United States Patent
Raju

(10) Patent No.: US 11,226,359 B2
(45) Date of Patent: Jan. 18, 2022

(54) SYSTEM AND METHOD TO GENERATE MULTI-LEVEL VOLTAGE PULSES FOR ELECTRICAL INSULATION TESTING

(71) Applicant: Ravisekhar Nadimpalli Raju, Clifton Park, NY (US)

(72) Inventor: Ravisekhar Nadimpalli Raju, Clifton Park, NY (US)

( * ) Notice: Subject to any disclaimer, the term of this patent is extended or adjusted under 35 U.S.C. 154(b) by 0 days.

(21) Appl. No.: 17/087,616

(22) Filed: Nov. 2, 2020

(65) Prior Publication Data

US 2021/0132129 A1    May 6, 2021

Related U.S. Application Data

(60) Provisional application No. 62/928,381, filed on Oct. 31, 2019.

(51) Int. Cl.
| | |
|---|---|
| *H01H 31/12* | (2006.01) |
| *G01R 27/26* | (2006.01) |
| *G01R 31/14* | (2006.01) |

(52) U.S. Cl.
CPC ......... *G01R 27/2629* (2013.01); *G01R 31/14* (2013.01)

(58) Field of Classification Search
CPC .... G01R 31/14; G01R 31/16; G01R 31/1218; G01R 31/129; G01R 31/1272; G01R 31/1254; G01R 31/2642; G01R 31/021; G01R 31/022; G01R 31/025; G01R 27/2629

See application file for complete search history.

(56) References Cited

U.S. PATENT DOCUMENTS

| | | | | |
|---|---|---|---|---|
| 5,818,236 | A * | 10/1998 | Sone | G01R 31/52 |
| | | | | 324/509 |
| 2014/0347070 | A1* | 11/2014 | Scheuschner | G01R 31/08 |
| | | | | 324/543 |
| 2019/0250204 | A1* | 8/2019 | Geiss | G01R 31/52 |
| 2020/0057103 | A1* | 2/2020 | Viereck | G01R 15/06 |
| 2020/0064410 | A1* | 2/2020 | Tong | G01R 27/02 |
| 2020/0166561 | A1* | 5/2020 | Winkelmann | G01R 31/083 |

\* cited by examiner

*Primary Examiner* — Thang X Le

(57) ABSTRACT

A system and method to generate high voltage pulses for testing of electrical insulation is presented. The system is comprised of multiple bridges in series that are connected across the insulation through an output inductor. The switching of the bridges are timed to allow a resonant half-cycle of current through the output inductor and the effective capacitance of the insulation which results in a transition of the voltage across the insulation from one level to another. The sequence of switching of the bridges is swapped intermittently such that the dc links of the bridges are substantially kept balanced. In one embodiment, only the dc link of the first bridge is supplied from an external source, while the other bridges are fed via the chain of series bridges from the first bridge through the switching operation of the circuit.

7 Claims, 6 Drawing Sheets

SYSTEM AND METHOD TO GENERATE MULTI-LEVEL VOLTAGE PULSES FOR ELECTRICAL INSULATION TESTING

CROSS-REFERENCE TO RELATED APPLICATION

This application claims the benefit of U.S. Provisional Patent Application No. 62/928,381, filed 31 Oct. 2019, which is incorporated by reference herein in its entirety.

BACKGROUND

The present disclosure relates to high voltage pulse generation systems for testing of insulation used in electrical components and equipment. Specifically, the present invention relates to a modular power electronic system and method for generating multi-level pulses that is comprised of multiple bridges in series that are controlled to impress high voltage pulses across the insulation of the electrical device under test.

Insulation systems in electrical equipment such as motors, generators and transformers are often subject to high voltage stresses and also have to withstand steep dv/dt stresses if they are coupled to power electronic converters such as adjustable speed drives which produce pulse-width-modulated waveforms. Winding insulation is a critical element determining the reliability and life expectancy of electrical machines and hence manufacturers typically test and characterize the insulation at elevated voltages during the design, manufacturing or servicing phases to ensure adequate quality. Often the machine insulation is tested using equipment such as motor drives or with hi-pot testers. Motor drives are typically expensive compared to the electrical machine and hi-pot testers typically do not provide high dv/dt output waveforms that are needed to thoroughly check the insulation. Therefore, what is needed are techniques that overcome the above mentioned disadvantages.

BRIEF SUMMARY OF THE INVENTION

Embodiments of the invention provide a system to supply pulsed voltages across the electrical insulation of a device under test such as a machine winding for purposes of testing, characterizing or qualifying the insulation.

In accordance with one aspect of the invention, multiple power electronic bridges are configured in series and controlled to provide a multi-level voltage output that is fed across the winding insulation through an inductance at the output of the bridges. The winding insulation can be, for instance, the turn-to-turn insulation or turn-to-ground (i.e., ground-wall) insulation. The insulation can be represented as a capacitor with some dissipative resistance for the purpose of operation or analysis of the circuit.

According to another aspect of the invention, the afore-mentioned bridges are sequentially switched to move the voltage across the winding from one level to another level.

According to a preferred embodiment, half the number of bridges are switched to initiate the transition of the winding voltage through the LC circuit consisting of the output inductance and the winding capacitance. The second set of half the number of bridges are then switched after a delay corresponding to the LC circuit resonance when the output current has substantially neared zero. This method of control ensures that all the bridges are switched at nearly zero current thus reducing switching stresses and losses in the power semiconductor switches used in the bridges. Additionally, the LC resonance facilitates generation of voltage pulses across the insulation capacitance by recirculating energy in the system and reducing input power needed from an external source.

According to yet another aspect of the invention, the afore-mentioned first set of bridges and second set of bridges are swapped occasionally with respect to which set initiates the transition of the pulse and which set completes the transition such that both sets of bridges can maintain substantially equal level of dc bus voltages or have balanced power losses.

According to yet another aspect of the invention, only the dc link of the first half-bridge located near the ground potential is fed by an external power supply, while the dc link of each of the other series-connected half-bridges is replenished from the previous half-bridge through the operation of the circuit without requiring it be separately fed from an external power supply.

Various other features and advantages will be made apparent from the following detailed description and the drawings.

BRIEF DESCRIPTION OF THE DRAWINGS

The present invention is illustrated by way of example and not limitation in the figures of the accompanying drawings in which like references indicate similar elements.

As shown in FIG. 1a, the system consists of multiple bridges that are connected in series and feed the insulation test piece through an output inductor. The test piece primarily behaves as a capacitor in the circuit. FIG. 1b illustrates the bridges being sequenced to move the voltage across the insulation through various levels in a manner where the bridges are switched substantially near zero currents to reduce power losses in the bridge switching elements. FIG. 1c shows the output current waveform fed to the device under test and the voltage across it.

FIGS. 6b, 6c, and 6d show the switching stages of the two full-bridges in transitioning the voltage across the device under test from −2V to +2V as shown in FIG. 6e.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" or "another embodiment" means that a particular feature, structure, or characteristic described in conjunction with the embodiment can be included in at least one embodiment of the invention.

Figure 1:
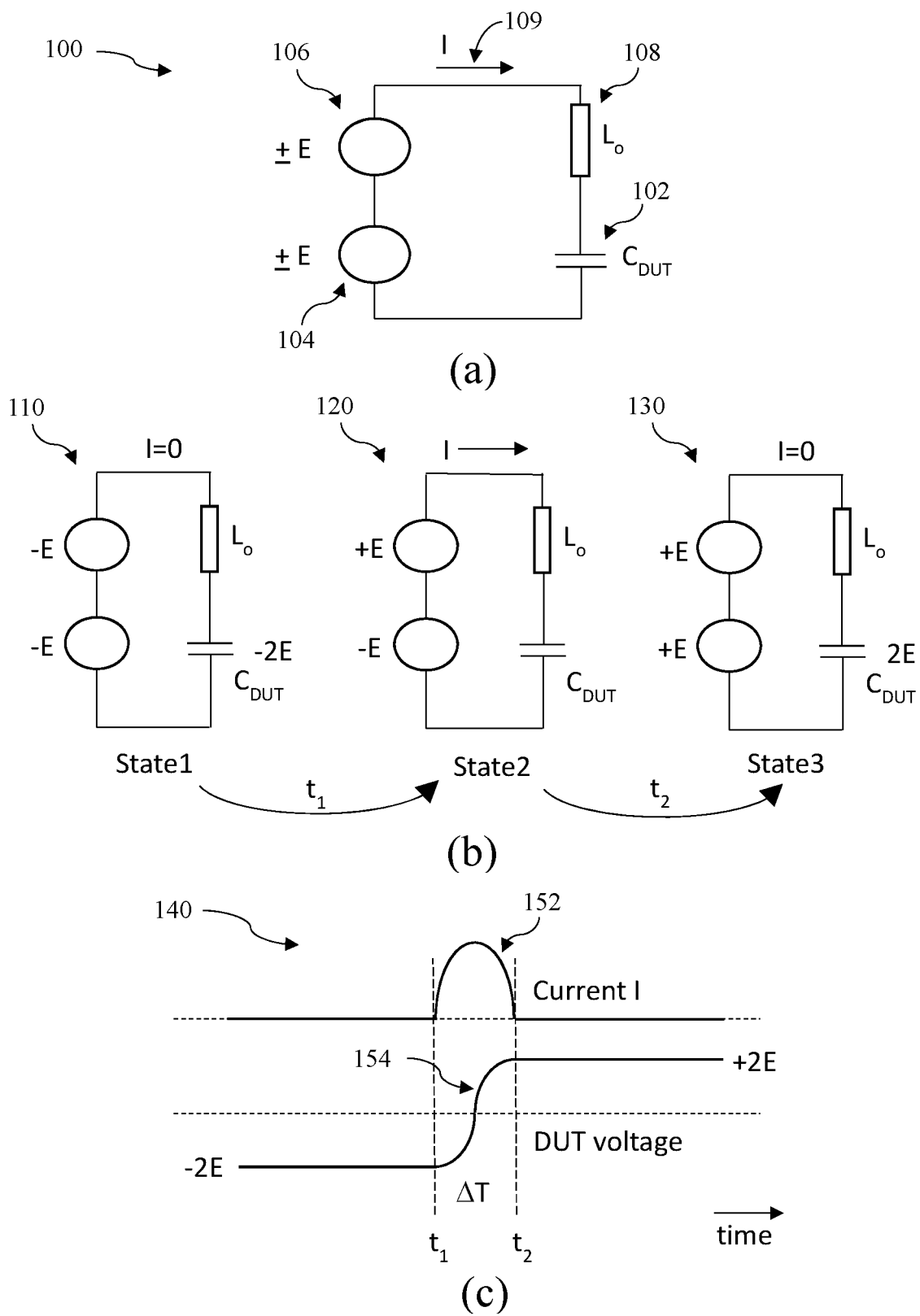
FIG. 1 illustrates a system and method to provide multi-level voltage pulses across a sample under test such as a winding insulation.

FIG. 1a illustrates an embodiment of the invention, wherein the system, 100, has a first bridge, 104, and a second bridge, 106, that are configured in series with each bridge capable of generating a +E or −E voltage output. The seriesed output is connected across the insulation (device under test), 102, through an output inductor ($L_O$), 108. The insulation can be represented essentially by its capacitance ($C_{DUT}$) for the purposes of analysis and operation of the system. In the illustration FIG. 1b, the two bridges are initially in a state 110, where each bridge is outputting a voltage of −E and the insulation capacitance is charged to −2E. A transition is made at time $t_1$ to state 120 where bridge 106 is switched from −E to +E output voltage. This results in a LC circuit resonance with the insulation capacitance voltage moving from −2E to +2E w and the output current going through a half-sinusoidal pulse and ending at near-zero current after the insulation capacitance is charged to +2E. At the end of this transition at time $t_2$, the system is moved to state 130 where bridge 104 is also switched from −E to +E to complete the transition and hold the voltage of the insulation capacitance at a level of +2E. The delay, ΔT, between the switching of the two bridges is kept substantially equal to the half-resonance period of the LC elements as shown in the waveforms 140 in FIG. 1c where the current is a half-cycle sinusoidal pulse, 152, and the voltage has a corresponding sinusoidal transition, 154, between levels −2E and +2E.

Figure 2:
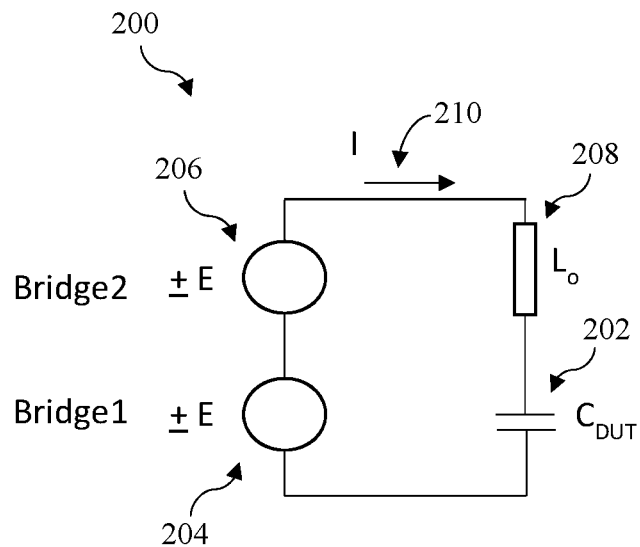
FIG. 2 illustrates a system wherein the simplified voltage sources developing a voltage of ±E each in FIG. 2a are implemented using half-bridges with power semiconductor switches such as MOSFETs (metal-oxide-semiconductor field-effect transistors) as shown in FIG. 2b.
Figure 2:
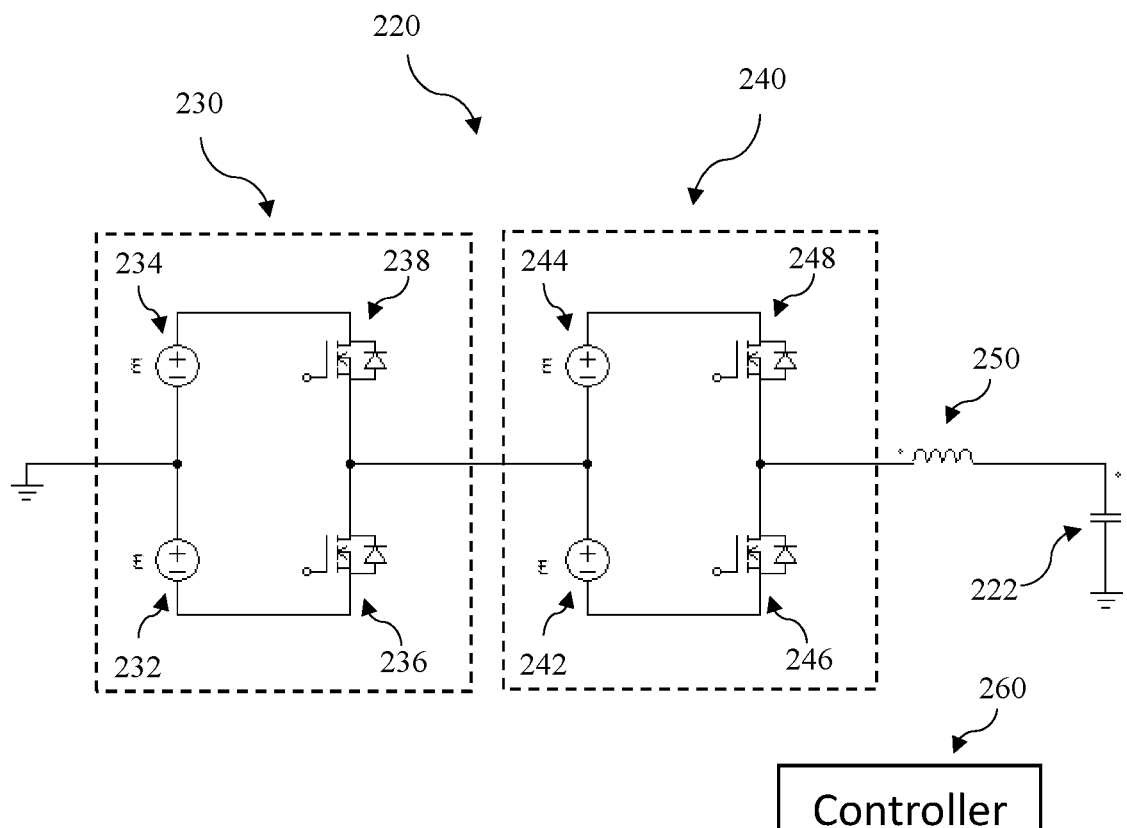

FIG. 2 illustrates an embodiment of the invention wherein FIG. 2a represents the simplified circuit schematic, 200, and FIG. 2b represents an implementation, 220, using two half-bridge switching cells. The first source, 204, is implemented by half-bridge cell, 230 and the second source, 206, is implemented by half-bridge cell, 240. Cells 230 and 240 consist of dc link voltages, 232, 234, 242 and 244 as well as switches 236, 238, 246, and 248. The insulation under test is represented by its effective capacitance, 222, and is fed from the series bridges through an inductor 250. A controller, 260, is used to control the switching of the bridges. The bridges are operated in the afore-mentioned manner to produce pulsed voltage of magnitude −2E to +2E, where ±E is the voltage produced by each bridge.

Figure 3:
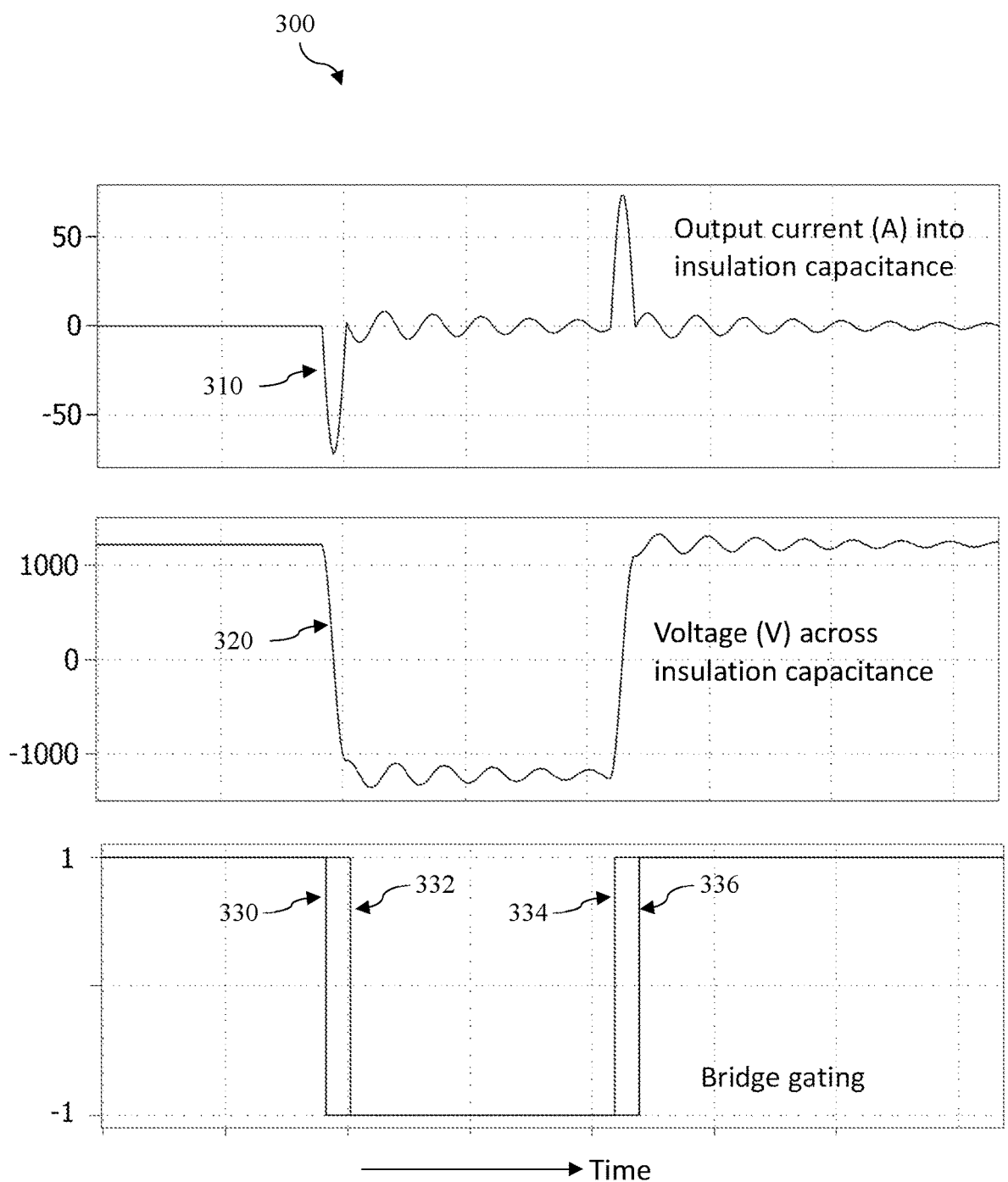
FIG. 3 illustrates output current, voltage across the insulation, and gating control signals for generating a positive and a negative pulse across the device under test. In this figure, two half-bridges such as those shown in FIG. 2 are used to generate the pulses with each half-bridge generating a voltage of ±600V such that a net output voltage of up to ±1200 V is impressed across the device under test

FIG. 3 illustrates, according to one embodiment of the present invention, the waveforms, 300, for operation of the circuit shown in FIG. 2. The output current, 310, representing a LC resonance is shown at the top, while the voltage impressed across the insulation, 320, is shown in the middle waveform. The waveforms at the bottom of the figure represent the gating signals for the two sets of bridges, with one set delayed essentially by a time substantially equal to the LC resonance half-period. 330 and 334 show the switching edges of the first bridge; and 332 and 336 show the switching edges of the second bridge for a system with two bridges. In this illustration the second bridge is delayed with respect to the first bridge. For maintaining balance of the dc link voltages of the two bridges, the first bridge can be delayed with respect to the second bridge for some of the cycles.

Figure 4:
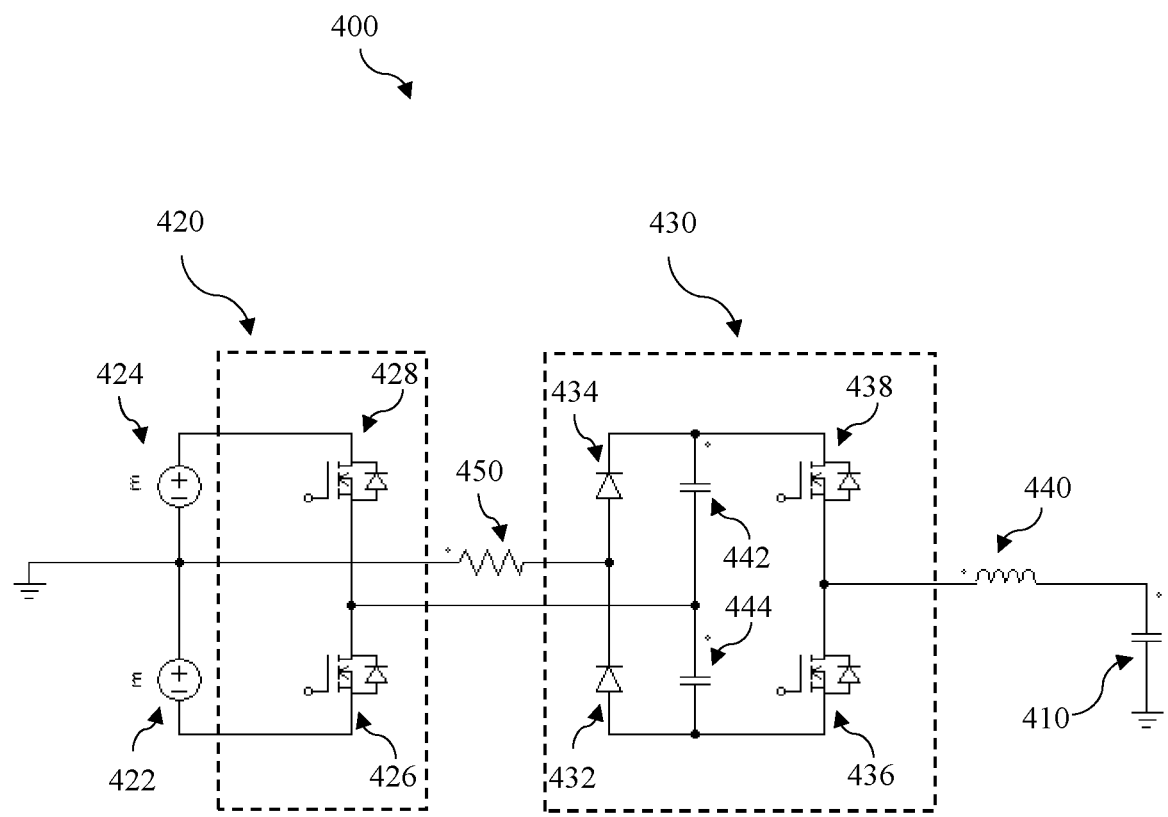
FIG. 4 illustrates a system wherein the first half-bridge is fed by two ground-referenced voltage sources, each of magnitude E, and the second half-bridge has dc link capacitors that are charged through diodes by the switching operation of the first half-bridge. This allows the system to be operated by feeding just the first half-bridge from an external source and by transfering power for the dc links of the subsequent half-bridges through the series chain of bridges.

FIG. 4 shows one embodiment of the invention, wherein the system 400 consists of two switching bridge cells, 420 and 430, feeding the insulation test piece, 410, through inductor, 440. The first bridge, 420, consists of switches 426 and 428 with a dc link maintained from external sources 422 and 424. The second bridge, 430, consists of dc capacitors, 442 and 444, switches 436 and 438, and diodes 432 and 434. With switch 428 on, source 424 charges capacitor 444 to voltage level E through diode 432 and resistor 450. In a similar fashion with switch 426 on, source 422 charges capacitor 442 to voltage level E through diode 434 and resistor 450. Thus the second bridge 430 does not require an external source of power but is fed indirectly through the switching action of the first bridge 420.

Figure 5:
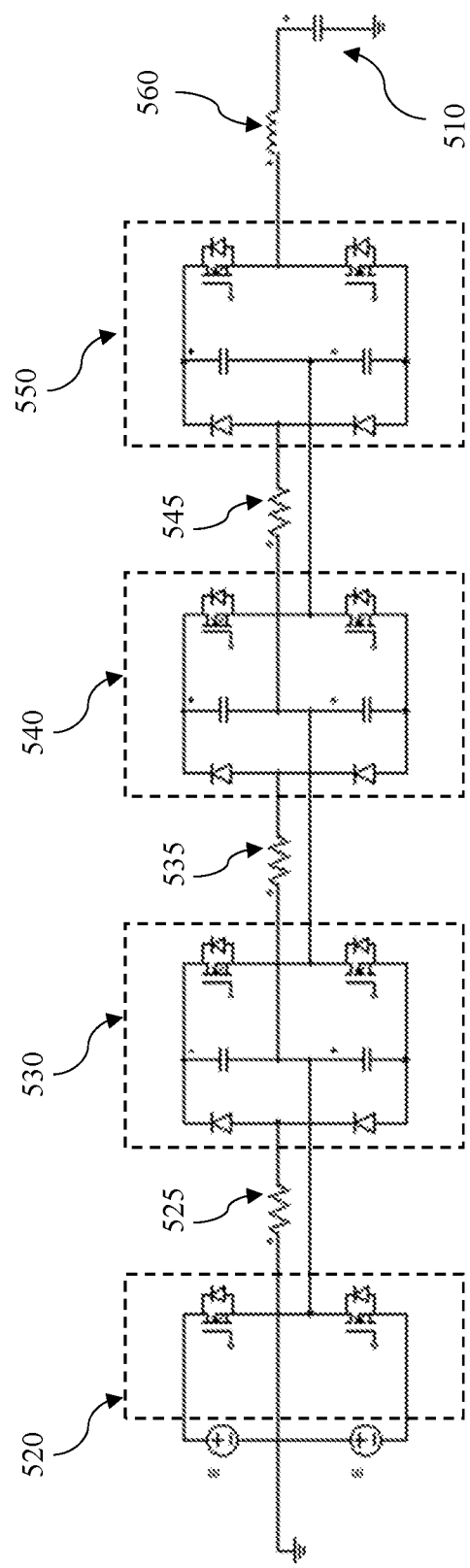
FIG. 5 illustrates a system wherein four series half-bridges are used in series and multi-level output voltage pulses of up to ±4E can be applied across the device under test with ±E being the split dc link voltage supply for the first half-bridge. The second and subsequent half-bridge blocks derive their dc link capacitance voltage by being fed through diodes from the output of the previous block.

FIG. 5 illustrates a system with multiple switching cells, 520, 530, 540 and 550 in series pulsing the insulation capacitance, 510 through inductor 560. The operation of the system is similar to that described earlier in FIGS. 1-4, and can provide voltage pulses up to ±4E across the insulation. The dc link of the first bridge is fed from an external source with the subsequent bridges kept charged through the chain of bridges and resistors 525, 535 and 545 in the manner described for the case with two bridges in FIG. 4.

Figure 6:
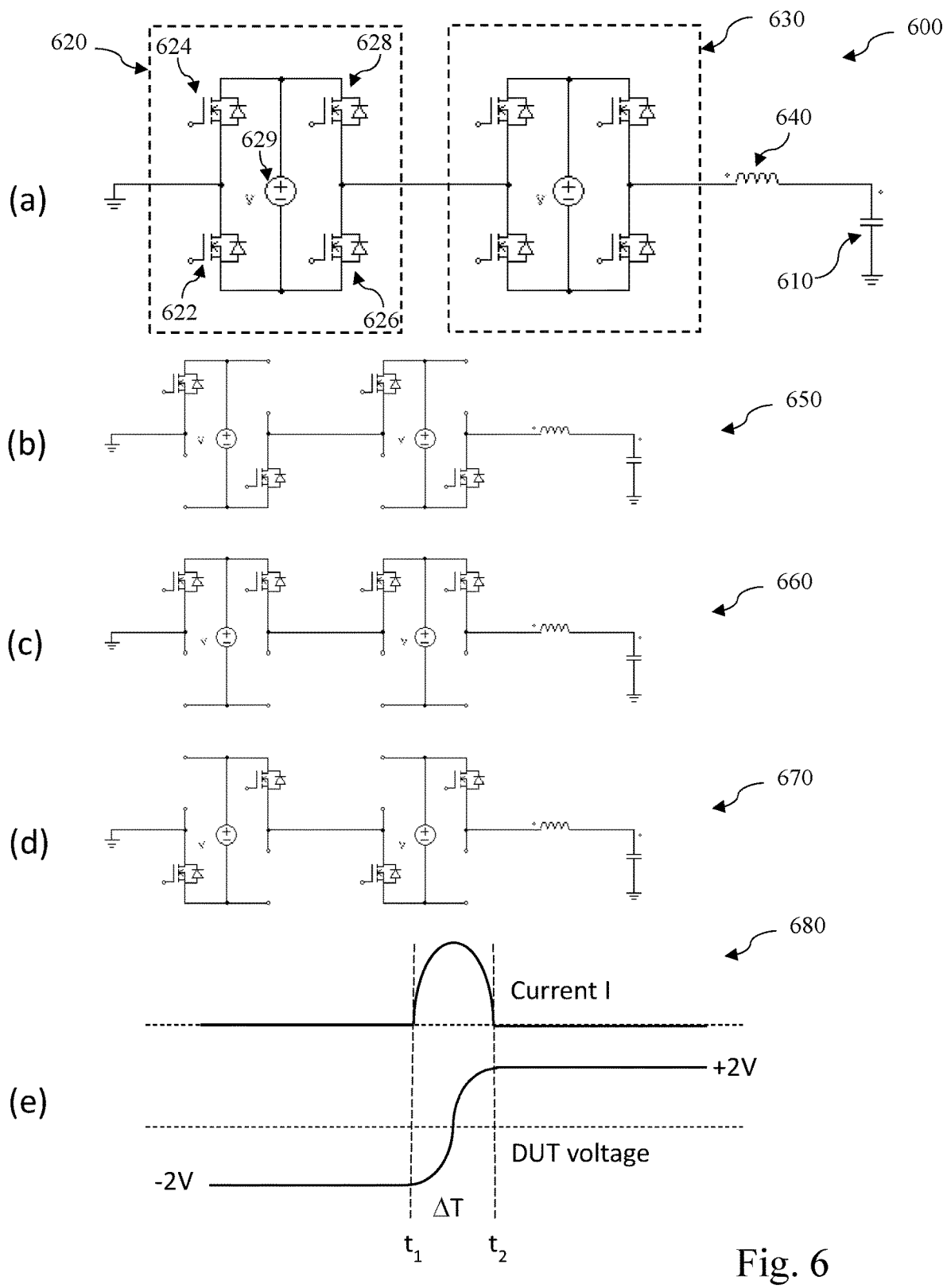
FIG. 6 illustrates a system wherein two full-bridges are used in series and multi-level output voltage pulses of up to ±2V can be applied across the device under test with V being the dc link voltage for each of the full-bridges.

FIG. 6 shows an embodiment, 600, with full bridges instead of half-bridges. FIG. 6a shows two full bridge switching cells 620 and 630 connected in series and across the insulation capacitance 610 through inductor 640. Switching cell 620 consists of switches 622, 624, 626 and 628 along with dc link voltage, 629, of value V and can produce an output of +V, 0 or −V. Switching cell 630 can also likewise produce an output voltage of +V, 0 or −V. The switching operation of the two cells to provide a voltage pulse from −2V to +2V at the output is shown in FIGS. 6b, c, and d. In state 650, a net voltage of −2E is present across the output. Subsequently at time $t_1$, the system moves to state 660 where a net output of zero voltage is presented by the bridges. This initiates a resonant LC half-cycle with the insulation capacitance moving in voltage from an initial condition of −2V to a resonant peak voltage of +2V and the output current going through a half cycle as shown in waveforms 680. At the end of the half-cycle with the insulation capacitance resonantly charged to +2V, the system is switched to state 670 where the switching cells have an output of +2V that matches and maintains the insulation capacitance voltage at +2V, thus completing one pulse. The pulses can be repeated at a user-set repetition rate or commanded to follow a pulse-width-modulated sequence.

Although switching cells based on half or full-bridges are described and illustrated in the figures, the switching cells can also be based on three-level or other multi-level structures. With multiple cells, only a portion of the cells can be switched during a particular pulse such that the resonant voltage pulses across the insulation capacitance are between intermediate levels of voltage instead of the full series voltage of the cells.

The foregoing description of exemplary embodiments of the invention has been presented for the purposes of illustration and description. It is not intended to be exhaustive or to limit the invention to the precise forms disclosed. It will be recognized by those skilled in the art that many modifications and variations are possible without departing from the essential scope of the invention. It is, therefore, to be understood that the scope of the invention is not limited to the particular embodiments disclosed, and that the invention will include all embodiments falling within the scope of the claims appended hereto.

What is claimed is:

1. A system providing pulsed output voltage for testing an electrical insulation, the system comprises multiple power switching bridges connected in series and wherein a net output voltage of the multiple power switching bridges is placed across the electrical insulation through an output inductor.

2. The system of claim 1, wherein the multiple power switching bridges are comprised of a diode half-bridge, a split dc-link capacitance, and a transistor half-bridge.

3. The system of claim 1, wherein only the split dc-link of a first power switching bridge located near ground potential is supplied by an external power supply and the subsequent power switching bridges have their dc links replenished through a series chain of the power switching bridges by a switching operation of the power switching bridges.

4. The system of claim 2, wherein the diode half-bridge of each bridge feeds a local dc link from an output of the previous bridge.

5. The system of claim 2, wherein half the number of the power switching bridges corresponding to an output voltage step to be impressed across the insulation under test are switched at an outset of a transition and a remaining set of half the number of bridges are switched at the end of the transition.

6. The system of claim 5, wherein the delay between the two sets of the power switching bridges is substantially equal to a half-period of a resonant circuit formed by the output inductor and the capacitance of the electrical insulation under test.

7. The system of claim 5, wherein the first set of the power switching bridges and second set of the power switching bridges are interchanged periodically in terms of which set is switched to initiate the output pulse and which set is switched at the completion of the output pulse so as to balance their dc link voltages.

* * * * *